United States Patent
Hackner et al.

(10) Patent No.: US 10,391,885 B2
(45) Date of Patent: Aug. 27, 2019

(54) METHOD FOR DETERMINING PERFORMANCE INFORMATION OF A BATTERY OF A MOTOR VEHICLE ON-BOARD POWER SYSTEM THAT IS CONNECTED TO A DIRECT CURRENT CONVERTER, AND MOTOR VEHICLE

(71) Applicant: Audi AG, Ingolstadt (DE)

(72) Inventors: Thomas Hackner, Greding (DE); Rolf Naumann, Etting (DE)

(73) Assignee: Audi AG, Ingolstadt (DE)

( * ) Notice: Subject to any disclaimer, the term of this patent is extended or adjusted under 35 U.S.C. 154(b) by 0 days.

(21) Appl. No.: 16/071,475

(22) PCT Filed: Jan. 12, 2017

(86) PCT No.: PCT/EP2017/050559
§ 371 (c)(1),
(2) Date: Jul. 19, 2018

(87) PCT Pub. No.: WO2017/125310
PCT Pub. Date: Jul. 27, 2017

(65) Prior Publication Data
US 2019/0210472 A1    Jul. 11, 2019

(30) Foreign Application Priority Data
Jan. 22, 2016  (DE) ......................... 10 2016 000 668

(51) Int. Cl.
*B60L 15/20* (2006.01)
*B60L 3/00* (2019.01)
(Continued)

(52) U.S. Cl.
CPC ......... *B60L 15/2045* (2013.01); *B60L 3/0046* (2013.01); *G01R 31/006* (2013.01); *G01R 31/387* (2019.01); *B60L 2210/40* (2013.01)

(58) Field of Classification Search
CPC ............... B60L 15/2045; B60L 3/0046; B60L 2210/40; G01R 31/387; G01R 31/006
See application file for complete search history.

(56) References Cited

U.S. PATENT DOCUMENTS 7,656,162 B2 * 2/2010 Vonderhaar ........ G01R 31/3648
                                                          324/426
7,888,912 B2 * 2/2011 Morita .................. B60L 3/0046
                                                          320/132
(Continued)

FOREIGN PATENT DOCUMENTS

DE    10 2011 087678 A1    6/2013
DE    10 2012 215755 A1    3/2014
(Continued)

OTHER PUBLICATIONS

International Search Report of the International Searching Authority directed to related International Patent Application No. PCT/EP2017/050559, dated Mar. 16, 2017, with attached English-language translation; 5 pages.

(Continued)

*Primary Examiner* — Russell Frejd
(74) *Attorney, Agent, or Firm* — Sterne, Kessler, Goldstein & Fox P.L.L.C.

(57) ABSTRACT

A method for determining a performance information, including a capacity information, of a battery of a motor vehicle on-board power network connected to a DC converter is disclosed. The DC converter is configured to impress at least one AC current with at least one predetermined frequency into the on-board power network. The capacity information is derived from at least one first electrical parameter at an output of the DC converter to the on-board power network and from at least one second electrical parameter that describes a reaction of the battery (Continued)

to the impressed AC current. A motor vehicle configured to perform the method is also disclosed.

14 Claims, 1 Drawing Sheet

(51) Int. Cl.
*G01R 31/00* (2006.01)
*G01R 31/387* (2019.01)

(56) References Cited

U.S. PATENT DOCUMENTS

| | | | |
|---|---|---|---|
| 7,940,052 B2 * | 5/2011 | Vonderhaar | G01R 31/3648 324/426 |
| 8,378,688 B2 * | 2/2013 | Ohkura | G01R 31/389 324/430 |
| 9,933,472 B2 | 4/2018 | Barth et al. | |
| 9,983,267 B2 | 5/2018 | Fassnacht et al. | |
| 2013/0241568 A1 | 9/2013 | Covasala | |
| 2014/0358459 A1 * | 12/2014 | Trnka | G01R 31/367 702/63 |
| 2015/0008929 A1 | 1/2015 | Ehrmann et al. | |

FOREIGN PATENT DOCUMENTS

| | | |
|---|---|---|
| DE | 10 2013 211742 A1 | 12/2014 |
| DE | 10 2013 219293 A1 | 3/2015 |
| DE | 10 2013 112678 A1 | 5/2015 |
| DE | 10 2014 004791 B3 | 8/2015 |
| DE | 10 2014 007016 A1 | 11/2015 |
| EP | 2533035 A1 | 12/2012 |
| JP | 2005 332702 A | 12/2005 |

OTHER PUBLICATIONS

International Preliminary Report on Patentability directed to related International Patent Application No. PCT/EP2017/050559, dated Jan. 22, 2018, with attached English-language translation; 14 pages.

* cited by examiner

METHOD FOR DETERMINING PERFORMANCE INFORMATION OF A BATTERY OF A MOTOR VEHICLE ON-BOARD POWER SYSTEM THAT IS CONNECTED TO A DIRECT CURRENT CONVERTER, AND MOTOR VEHICLE

TECHNICAL FIELD

This disclosure relates to a method for determining performance information of a battery of a motor vehicle on-board power system that is connected to a direct current (DC) converter. This disclosure also relates to a motor vehicle.

BACKGROUND

To ensure proper functionality of the on-board power network of a motor vehicle, determination of the capacity information relating to the on-board power network battery is of great importance to operate the battery under an optimum charging and discharging strategy. For conventional motor vehicles having only a single on-board power network and typically a lead-acid battery with a nominal voltage of 12 volts, the capacity information is determined by measuring a battery current, a battery voltage, and a battery temperature. Because such on-board power networks are fed by way of a claw-pole generator that generates a current ripple in the on-board power network, the excitation of the battery due to this current ripple can also be utilized for purposes of determining the capacity information.

This option of determining the capacity information is not deterministic, however; in particular it depends on the power draw and output of the claw-pole generator and on the users and cabling of the on-board power network. In electrically-driven motor vehicles, and/or vehicles having multiple on-board power networks coupled by way of a DC converter, sometimes there is no claw-pole generator in the on-board power network because the battery is dynamically fed by the DC converter. A current ripple, which can be used to determine the capacity information, is consequently not present in such on-board power networks.

From DE 10 2014 007 016 A1, a method is known for determining a status information that describes the charge state and/or the capacity of a first electrical energy storage device, wherein the first electrical energy storage device is connected in series to a second electrical energy storage device. Here, a defined amount of electrical energy is introduced from the second energy storage device to the first energy storage device, whereupon a variable state parameter of the first energy storage device is determined as a function of the amount of electrical energy introduced, and the status information is determined using the state parameter.

DE 10 2013 219 293 A1 discloses a vehicle with a high-voltage on-board power network, a low-voltage on-board power network, a DC chopper between the two on-board power networks, a low-voltage energy storage device in the low-voltage on-board power network, and a high-voltage energy storage device in the high-voltage on-board power network. Here, when the vehicle is in a stance phase (for example, standing or waiting while idling), the low-voltage energy storage device can be loaded at a predefinable current pulse by the DC chopper, and the current response to the current pulse can be measured using a battery sensor associated with the low-voltage energy storage device.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

Figure 1:
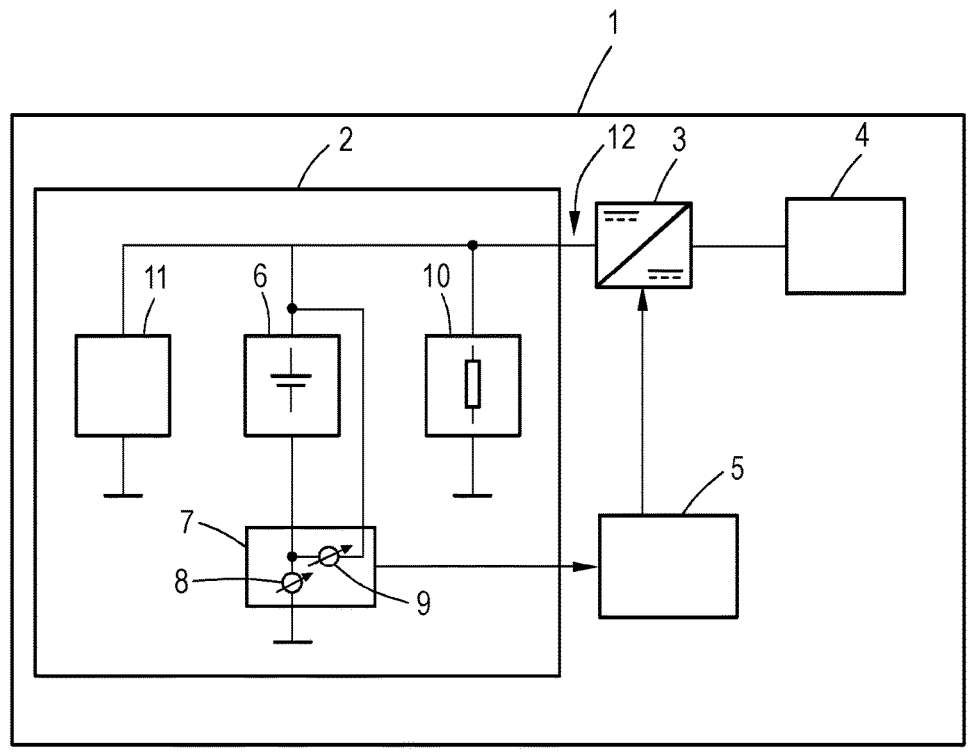
FIG. 1 illustrates a principal sketch of a motor vehicle, according to some embodiments.

The features and advantages of the present embodiments will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The object of this disclosure is to provide a way to determine the capacity information in an on-board power network connected to a DC converter that is more reliable than prior disclosures.

To achieve this, a method for determining performance information of a battery of a motor vehicle on-board power system that is connected to a direct current (DC) converter is proposed, wherein the DC converter is made to impress at least one AC current with at least one predetermined frequency into the on-board power network. The performance information can be capacity information, for example. The capacity information can be derived from at least one first electrical parameter at an output of the DC converter on the on-board power network side and from at least one second electrical parameter that describes the reaction of the battery to the impressed AC current.

This disclosure relates to the consideration of controlling the DC converter feeding the on-board power network specifically to generate an output signal having an AC portion at the output of the converter on the on-board power network side and to determine the capacity of the battery from the reaction thereof. This allows the current ripple generated by the claw-pole generator in conventional methods to be replaced by the at least one deterministic AC current and impressed into the on-board power network. The DC converter also generates a DC portion at the output thereof, the DC portion being considerably greater than the effective voltage of the at least one AC current. The current and/or voltage at the DC converter output on the on-board power network side can be adjusted so that the output signal can be generated thereby using the at least one AC current or AC portion by way of suitably varying said current and/or voltage.

In conjunction with the method disclosed herein, the first electrical parameter at the DC converter output on the on-board power network side describes the electrical characteristics of the at least one AC current, wherein said first electrical parameter can be measured or already exists from the control data affecting the controls of the DC converter. On the other hand, the at least one second electrical parameter is recorded, particularly measured, at the battery, for which purpose the measurement data of a battery controller associated with the battery are used. The battery is preferred to be a lead-acid battery with a nominal voltage of 12 volts or 24 volts.

The capacity information describes a charge state (State of Charge—SOC) in particular and/or a state of health (State of Health—SOH) of the battery. These states can—as is basically already known in the prior art—be derived from the reaction to the excitation of the battery by the at least one AC current described by the first electrical parameter, the reaction being described by the second electrical parameter. It is preferable to use a controller associated with the on-board power network, in particular an energy management controller, to carry out the method disclosed herein, the controller being designed to communicate with the battery controller and the DC converter.

This advantageously facilitates the determination of capacity information largely independent of noise factors such as the operating characteristics of users of the on-board power network and the topology of the cabling thereof. Capacity information can then be found deterministically. In comparison to conventional methods in which the reaction of the battery to a sudden increase in current occurring during the starting phase of the motor vehicle is determined, the method can also be carried out at any point in time during the operation of the motor vehicle. In particular, the first electrical parameter is more precisely understood as the current ripple of the claw-pole generator or the switching behavior, in particular the switching time and the edge steepness of a DC converter during a current impulse. Consequently, a more reliable determination of capacity information can be realized.

In the method disclosed herein, it is useful if a current and/or applied voltage at the DC converter output on the on-board power network side is recorded. This can be done on one hand by measuring this current or voltage, or also using control data present in the controller for controlling the DC converter. Alternatively or additionally, a current and/or voltage can be measured at the battery within a measurement range encompassing the at least one frequency as a second electrical parameter. To this end, it is preferable and beneficial to use a current meter or a voltmeter that is integrated in the battery controller. The at least one first electrical parameter and the at least one second electrical parameter are both preferred to describe the current or voltages as a variation over time and/or as a frequency spectrum.

In the method, it is particularly preferred for an AC current with a plurality of different and overlapping frequencies to be used. It is beneficial to select these frequencies such that the reactions thereof, respectively, caused at the battery can be differentiated by way of the at least one second electrical parameter. Alternatively, it is also conceivable that a plurality of AC currents impressed one after the other in a temporal sequence are used, each current having at least one frequency. Consequently, a plurality of time sections are defined at which an AC current is impressed into the on-board power network at one or more frequencies so that the at least one second electrical parameter is recorded for every time section. The result is the recording of different frequency-dependent reactions of the battery and conclusions drawn therefrom about the capacity of the battery.

In the method, it is advantageous if at least one component of an equivalent circuit diagram of the battery is determined using the at least one first electrical parameter and the at least one second electrical parameter, wherein the capacity information is derived from characteristics of the at least one component. A multitude of equivalent circuit diagrams for batteries is known from the prior art that model the operating characteristics thereof. Characteristics of components can be resistance, capacitance, or inductance values of corresponding effective resistances or reactances. For example, there is the equivalent circuit diagram according to Randles, which is particularly suitable for deriving the capacity information. Therefore, it is particularly preferred for an equivalent circuit diagram to be used that includes an electrolyte resistance and/or a charge transfer resistance and/or a Warburg impedance and/or a double-layer capacitance as components. In determining the characteristics of the components of the equivalent circuit diagram, it is basically preferable for the number of frequencies used to be at least equal to the number of components to be determined.

Also, it is preferable for the method to use a DC converter that couples the on-board power network to another on-board power network. This other on-board power network is preferred to be a high-voltage on-board power network for supplying an electric motor of the motor vehicle or a low-voltage on-board power network of higher operating voltage than the nominal voltage of the battery. The high-voltage on-board power network has a nominal voltage of at least 60 volts in particular, and preferably at least 300 volts. In the low-voltage on-board power network as the other on-board power network, it is preferred to use a nominal voltage of 48 volts. In this way, the DC converter makes power transfer between the two on-board power networks possible. In particular, when using a high-voltage on-board power network as the other on-board power network, electrical energy recovered through recuperation can be fed to the on-board power network.

The method can basically be carried out continuously during operation of the motor vehicle. However, it is preferred for the method to be carried out on demand from an energy management system of the motor vehicle, particularly implemented through the controller, and/or cyclically and/or during starting of the motor vehicle. Advantageously, the determination of the capacity information can be carried out in a broad spectrum of operating states so that the information can be flexibly updated during operation of the motor vehicle.

This disclosure also relates to a motor vehicle comprising a battery of an on-board power network connected to a DC converter. The motor vehicle also comprises a controller that is adapted to carry out the method disclosed herein. All embodiments of the method can be transferred analogously to the motor vehicle so that the advantages mentioned above can be achieved for the motor vehicle using the method.

Figure 2:
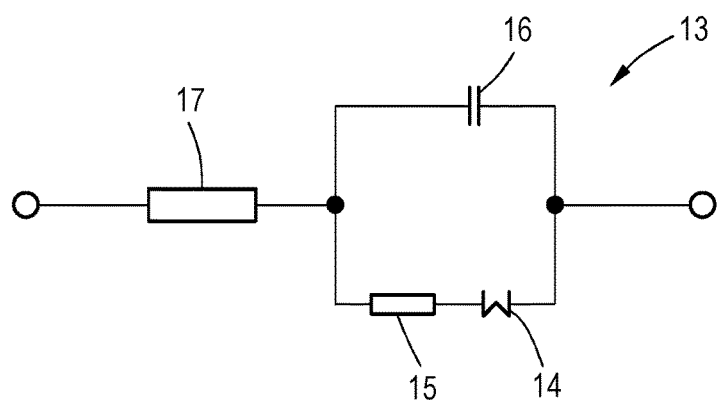
FIG. 2 illustrates an equivalent circuit diagram for use in a method for determining performance information of a battery of a motor vehicle on-board power system that is connected to a direct current converter, according to some embodiments.

Other details and advantages result from the exemplary embodiments described below and from the drawings. The drawings are schematic representations and show:

In FIG. 1, a principle sketch of a motor vehicle as disclosed herein, according to some embodiments; and in FIG. 2, an equivalent circuit diagram for use in a method as disclosed herein, according to some embodiments.

FIG. 1 shows a principal sketch of an exemplary embodiment of a motor vehicle 1 comprising a first on-board power network 2 connected to a DC converter 3. The first on-board power network 2 is connected to a second on-board power network 4 by way of the DC converter 3. In addition, a controller 5 is provided that is designed to control the DC converter 3.

The first on-board power network 2 comprises a battery 6 in the form of a lead-acid battery with a nominal voltage of 12 volts, said battery 6 being associated with a battery controller 7. The battery controller 7 comprises a current measuring unit 8 that measures the variation over time and the frequency spectrum of a current flowing through battery 6. In addition, a voltage measuring unit 9 is provided that measures the variation over time and the frequency spectrum of the voltage applied at battery 6. The first on-board power network 2 further comprises a plurality of users 10, which are shown schematically only.

The second on-board power network 4 is a high-voltage on-board power network having a nominal voltage of 300 volts and feeding an electric motor (not shown) of the electrically-driven motor vehicle 1. The DC converter 3 is used to adjust the various voltage levels of the first and second on-board power networks 2 and 4, respectively, and is designed as a bi-directional DC converter to enable a transfer of power from the first on-board power network 2 to the second on-board power network 4 and vice versa. In this way, electrical energy that is recovered through recuperation, for example, can be fed from the second on-board power network 4 to the first on-board power network 2. In another exemplary embodiment, the second on-board power network 4 is a low-voltage on-board power network with a nominal voltage of 48 volts, the power supply being designed to feed users specifically designed to operate at this voltage level. In the process, the first on-board power network 2 comprises a starter generator 11 for starting an internal combustion engine (not shown) of the motor vehicle 1.

The controller 5 implements an energy management system for the motor vehicle 1 and is designed to carry out a method, described below, for determining a performance information, specifically a capacity information, of the battery 6 of the first on-board power network 2 connected to the DC converter 3 on the motor vehicle side.

The DC converter 3 generates a DC voltage of 14 volts for charging the battery 6. The controller 5 also controls the DC converter 3 for generating an AC current having a plurality of frequencies, the AC current varying in voltage at output 12. A voltage and a current at output 12 are each recorded as a respective first electrical parameter and describe the output signal of DC converter 3 over time and the frequency spectrum of said signal. These first electrical parameters are known from the control data of controller 5 for DC converter 3 or can be determined from said data. In an alternative exemplary embodiment, the first electrical parameters are measured at output 12 of DC converter 3 using additional voltage and current measuring units (not shown).

The impressed AC current generates a reaction at the battery 6, and this reaction is described using the second electrical parameters that are measured using the current measuring unit 8 and the voltage measuring unit 9. With the information gained from the second electrical parameters describing the current and voltage over time and the frequency spectra thereof, in combination with the first electrical parameters that trigger the reaction, the controller 5 can determine the properties of an equivalent circuit diagram according to Randles for battery 6.

FIG. 2 shows the equivalent circuit diagram 13 used in the method. This diagram encompasses a charge transfer resistance 15, which is connected in series with a Warburg impedance 14, and a double-layer capacitance 16 is connected in parallel therewith. There is also an electrolyte resistance 17 connected in series with the parallel circuit of Warburg impedance 14, double-layer capacitance 16, and charge transfer resistance 15. The AC current generated by the DC converter 3 comprises at least as many frequencies as the number of components of the equivalent circuit diagram 13 so that the properties of the components, i.e., the resistance values for the charge transfer resistance 15 and the electrolyte resistance 17, a reactance value for the double-layer capacitance 16, and a Warburg coefficient for the Warburg impedance 14, can be determined by computation.

From these properties, the controller 5 derives the capacity information that describes a state of charge (State of Charge—SOC) and a state of health (State of Health—SOH) of battery 6 and uses the capacity information in determining a charging and discharging strategy for battery 6. In addition, the capacity information can be called up during maintenance of controller 5 and is evaluated for purposes of issuing a warning to the driver of the motor vehicle 1 in the event of insufficient capacity of battery 6.

The method is carried out when the motor vehicle 1 is started and then cyclically, and on demand by controller 5 as required. In alternative exemplary embodiments, the method is carried out continuously.

In another exemplary embodiment of the method, instead of a single AC current comprising a plurality of frequencies, a plurality of AC currents are impressed into the first on-board power network 2, each current having one or more frequencies. Accordingly, the determination of properties of the components of the equivalent circuit diagram 13 is done after recording the second electrical parameters for each of the many AC currents.

The invention claimed is:

1. A method for determining a performance information of a battery of a first on-board power network of a motor vehicle, wherein the first on-board power network is connected to a DC converter, the method comprising:
    impressing, by the DC converter, at least one AC current with at least one predetermined frequency into the first on-board power network;
    deriving the performance information, including capacity information, from at least one first electrical parameter at an output of the DC converter to the first on-board power network and from at least one second electrical parameter describing a reaction of the battery to the impressed at least one AC current;
    determining a plurality of component values of an equivalent circuit of the battery using the at least one first electrical parameter and the at least one second electrical parameter,
    wherein the determining the plurality of component values comprises:
        using the at least one AC current, having a plurality of different predetermined frequencies that overlap one another, wherein the number of the plurality of different predetermined frequencies used is at least equal to the number of the plurality of component values to be determined; or
        using a plurality of AC currents, each impressed in a temporal sequence; and
    deriving the capacity information from the plurality of component values.

2. The method of claim 1, further comprising:
    recording, as the at least one first electrical parameter, a current or a voltage at the output of the DC converter; and
    measuring, as the at least one second electrical parameter, a current or a voltage at the battery within a measurement range that includes the at least one predetermined frequency.

3. The method of claim 1, wherein the determining the plurality of component values of the equivalent circuit further comprises:

determining circuit values of a circuit that comprises an electrolyte resistance, a charge transfer resistance, a Warburg impedance, or a double-layer capacitance.

4. The method of claim 1, further comprising:
coupling, by the DC converter, the first on-board power network to a second on-board power network.

5. The method of claim 4, wherein the second on-board power network is a high-voltage on-board power network for supplying power to an electric motor of the motor vehicle.

6. The method of claim 4, wherein the second on-board power network is a low-voltage on-board power network of higher operating voltage than a nominal voltage of the battery.

7. The method of claim 1, wherein the method is carried out by command from an energy management system of the motor vehicle, cyclically, or at start-up of the motor vehicle.

8. A motor vehicle, comprising an energy management system, further comprising:
a battery of a first on-board power network;
a DC converter, connected to the battery, wherein the DC converter is configured to:
impress at least one AC current with at least one predetermined frequency into the first on-board power network; and
a controller, connected to the DC converter, wherein the controller is configured to:
derive performance information of the battery, the performance information including capacity information, from at least one first electrical parameter at an output of the DC converter to the first on-board power network and from at least one second electrical parameter describing a reaction of the battery to the impressed at least one AC current;
determine a plurality of component values of an equivalent circuit of the battery using the at least one first electrical parameter and the at least one second electrical parameter,
wherein, to determine the plurality of component values, the controller is further configured to:
use the at least one AC current, having a plurality of different predetermined frequencies that overlap one another, wherein the number of the plurality of different predetermined frequencies used is at least equal to the number of the plurality of component values to be determined; or
use a plurality of AC currents, each impressed in a temporal sequence; and
derive the capacity information from the plurality of component values.

9. The motor vehicle of claim 8, wherein the controller is further configured to:
record, as the at least one first electrical parameter, a current or a voltage at the output of the DC converter; and
measure, as the at least one second electrical parameter, a current or a voltage at the battery within a measurement range that includes the at least one predetermined frequency.

10. The motor vehicle of claim 8, wherein to determine the plurality of component values of the equivalent circuit, the controller is further configured to:
determine circuit values of a circuit that comprises an electrolyte resistance, a charge transfer resistance, a Warburg impedance, or a double-layer capacitance.

11. The motor vehicle of claim 8, further comprising:
a second on-board power network, coupled by the DC converter to the first on-board power network.

12. The motor vehicle of claim 11, wherein the second on-board power network is a high-voltage on-board power network for supplying power to an electric motor of the motor vehicle.

13. The motor vehicle of claim 11, wherein the second on-board power network is a low-voltage on-board power network of higher operating voltage than a nominal voltage of the battery.

14. The motor vehicle of claim 8, wherein the controller is configured to operate by command of the energy management system, cyclically, or at start-up of the motor vehicle.

* * * * *